(12) United States Patent
Choo et al.

(10) Patent No.: US 10,812,054 B2
(45) Date of Patent: Oct. 20, 2020

(54) DIGITALLY-CONTROLLED OSCILLATORS HAVING CURRENT MIRRORS AND NEGATIVE-FEEDBACK CIRCUITS THEREIN THAT SUPPORT HIGH POWER SUPPLY REJECTION RATIO (PSRR) AND LOW NOISE CHARACTERISTICS

(71) Applicant: Samsung Electronics Co., Ltd., Suwon-si, Gyeonggi-do (KR)

(72) Inventors: Kang-yeop Choo, Hwaseong-si (KR); Woo-seok Kim, Suwon-si (KR); Tae-ik Kim, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 16/270,622

(22) Filed: Feb. 8, 2019

(65) Prior Publication Data

US 2020/0021278 A1    Jan. 16, 2020

(30) Foreign Application Priority Data

Jul. 13, 2018    (KR) .......................... 10-2018-0081757

(51) Int. Cl.
*H03L 7/00* (2006.01)
*H03K 3/03* (2006.01)
*H03L 7/099* (2006.01)

(52) U.S. Cl.
CPC ......... *H03K 3/0315* (2013.01); *H03L 7/0991* (2013.01)

(58) Field of Classification Search
CPC ........................... H03K 3/0315; H03L 7/0991
USPC ..................... 331/34, 57, 185, 186
See application file for complete search history.

(56) References Cited

U.S. PATENT DOCUMENTS

| | | | | |
|---|---|---|---|---|
| 5,831,486 A | * | 11/1998 | Wehbi | ...................... H03B 5/04 331/57 |
| 6,737,909 B2 | * | 5/2004 | Jaussi | .................. G01R 35/007 327/541 |
| 6,798,296 B2 | | 9/2004 | Lin et al. | |
| 6,842,079 B2 | | 1/2005 | Ingino, Jr. | |
| 7,800,454 B2 | | 9/2010 | Vanselow et al. | |
| 9,000,857 B2 | | 4/2015 | Lahiri et al. | |
| 2007/0290731 A1 | * | 12/2007 | MacDonald | .............. G06F 1/22 327/198 |

(Continued)

*Primary Examiner* — Richard Tan
(74) *Attorney, Agent, or Firm* — Myers Bigel, P.A.

(57) ABSTRACT

A digitally-controlled oscillator (DCO) includes a current mirror configured to generate a reference current at a first output terminal thereof, and a supply current having a magnitude proportional to a magnitude of the reference current at a second output terminal thereof. An oscillation circuit is provided, which is responsive to the supply current at an input node thereof. This oscillation circuit generates a periodic output signal having a frequency that varies in response to changes in the magnitude of the supply current. A variable resistance circuit is provided, which is responsive to a first control signal having a magnitude that influences a value of a resistance provided between a first node thereof, which receives the reference current, and a second node thereof. A negative feedback circuit is provided, which has first and second current carrying terminals electrically coupled to the first output terminal of the current mirror and the first node of the variable resistance circuit, respectively, and a control terminal electrically coupled to the input node of the oscillation circuit.

20 Claims, 17 Drawing Sheets

(56) References Cited

U.S. PATENT DOCUMENTS

| | | | |
|---|---|---|---|
| 2008/0101521 A1* | 5/2008 | Lee | H03L 7/0898 |
| | | | 375/371 |
| 2009/0231051 A1* | 9/2009 | Tokuyama | H03B 5/1228 |
| | | | 331/117 R |
| 2009/0295439 A1 | 12/2009 | Tsai et al. | |
| 2013/0113573 A1* | 5/2013 | Frantzeskakis | H03K 3/0315 |
| | | | 331/34 |
| 2016/0359493 A1 | 12/2016 | Chen et al. | |
| 2017/0194974 A1 | 7/2017 | Sumesaglam | |
| 2018/0017982 A1 | 1/2018 | Song et al. | |

* cited by examiner

US 10,812,054 B2

DIGITALLY-CONTROLLED OSCILLATORS HAVING CURRENT MIRRORS AND NEGATIVE-FEEDBACK CIRCUITS THEREIN THAT SUPPORT HIGH POWER SUPPLY REJECTION RATIO (PSRR) AND LOW NOISE CHARACTERISTICS

REFERENCE TO PRIORITY APPLICATION

This application claims priority to Korean Patent Application No. 10-2018-0081757, filed Jul. 13, 2018, in the Korean Intellectual Property Office, the disclosure of which is hereby incorporated herein in its entirety by reference.

BACKGROUND

The inventive concept relates to a digitally-controlled oscillators and, more particularly, to a digitally-controlled oscillators that utilize current mirrors therein.

An oscillation signal may be utilized within integrated circuits in various ways. For example, the operation of an integrated circuit for processing digital signals may be synchronized to an oscillation signal (or clock signal). In addition, an oscillation signal may be used to process analog signals, such as a signal in a radio frequency (RF) band. In order to generate an oscillation signal, a digital circuit, such as a digital phase-locked loop (PLL), may be used instead of an analog circuit such as an analog PLL. The digital circuit typically should include a digitally-controlled oscillator (DCO) having good overall power, noise and stability characteristics.

SUMMARY

The inventive concept provides a digitally-controlled oscillator (DCO) having good characteristics.

According to an embodiment of the inventive concept, there is provided a DCO including a current mirror, which is configured to generate a supply current based on a reference current, and an oscillation circuit, which is configured to receive the supply current through an input node. A variable resistor is also provided, which is configured to provide a path through which the reference current passes and to provide a variable resistance according to a first control signal including at least one bit. A negative feedback circuit may also be provided, which is configured to control the reference current based on a voltage of the input node.

According to another embodiment of the inventive concept, a DCO is provided that includes a current mirror, which is configured to generate a supply current based on a reference current, and an oscillation circuit, which is configured to receive the supply current through an input node. A variable resistor is provided, which is configured to receive a first control signal such as a one or more bit digital control signal. An n-channel transistor is provided, which includes a drain that is configured to receive the reference current from the current mirror, a source that is configured to output the reference current to the variable resistor, and a gate that is coupled to the input node.

According to a further embodiment of the inventive concept, there is provided a DCO including a current mirror configured to generate a supply current based on a reference current, and an oscillation circuit configured to receive the supply current through an input node. This DCO also includes a variable resistor configured to provide a path through which the reference current passes and to provide a variable resistance according to a first control signal, such as a digital control signal having at least one bit. The current mirror may include a bias circuit configured to generate a bias voltage based on the first control signal.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
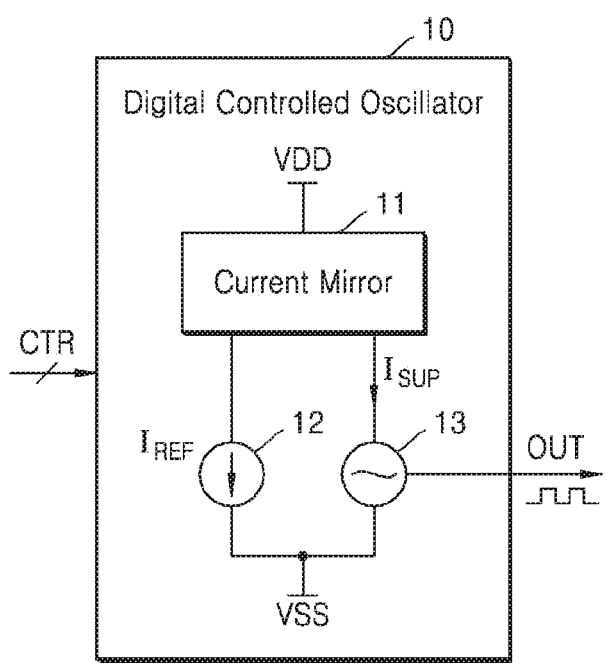
FIG. 1 is a block diagram of a digitally-controlled oscillator (DCO) according to an example embodiment.

FIG. 1 is a block diagram of a digital controlled oscillator (DCO) 10 according to an example embodiment. In some embodiments, the DCO 10 may be implemented as an integrated circuit manufactured by a semiconductor process. In some embodiments, the DCO 10 may include at least one semiconductor package containing an integrated circuit therein, and a board on which the semiconductor package is mounted.

The DCO 10 may generate an output signal OUT that oscillates with a frequency $f_{OUT}$ adjusted according to a control signal CTR including at least one bit. As shown in FIG. 1, the DCO 10 may include a current mirror 11, a current source 12, and an oscillation circuit 13. The current mirror 11 may be connected to the current source 12 and the oscillation circuit 13 and may generate a supply current $I_{SUP}$ based on a reference current $I_{REF}$. The current source 12 may draw the reference current $I_{REF}$ from the current mirror 11, and the oscillation circuit 13 may generate the output signal OUT having the frequency $f_{OUT}$ that varies according to the supply current $I_{SUP}$. The magnitude of the reference current $I_{REF}$ and/or the magnitude of the supply current $I_{SUP}$ may vary according to the control signal CTR, and consequently the frequency $f_{OUT}$ of the output signal OUT may be determined according to the control signal CTR. In the present specification, the output signal OUT may be referred to as an oscillation signal, a clock signal, and the like, and the frequency $f_{OUT}$ of the output signal OUT may be referred to as an output frequency.

Due to a refined semiconductor process, a decrease in a supply voltage and an increase in a leakage current may occur in an integrated circuit. Accordingly, the design of an analog circuit that provides good performance may not be easy, and a digital circuit that replaces an analog circuit may be required. A digital circuit for generating an oscillation signal that may be used in various applications in an integrated circuit may also be required. For example, a digital phase-locked loop (PLL) may be implemented to replace a charge pump phase-locked loop (CPPLL) that is an analog circuit, and the performance of the digital PLL may depend on the performance of a DCO. As described below with reference to FIGS. 2A and 2B, a general DCO may have degraded characteristics, such as a low power supply rejection ratio (PSRR), high power consumption, high noise sensitivity, and a narrow frequency range. As described below with reference to drawings, the DCO 10 of FIG. 1 may provide improved PSRR and noise characteristics by overcoming a trade-off relationship between a PSRR and noise characteristics, and may also provide reduced power consumption and a wide frequency range.

Figure 2A:
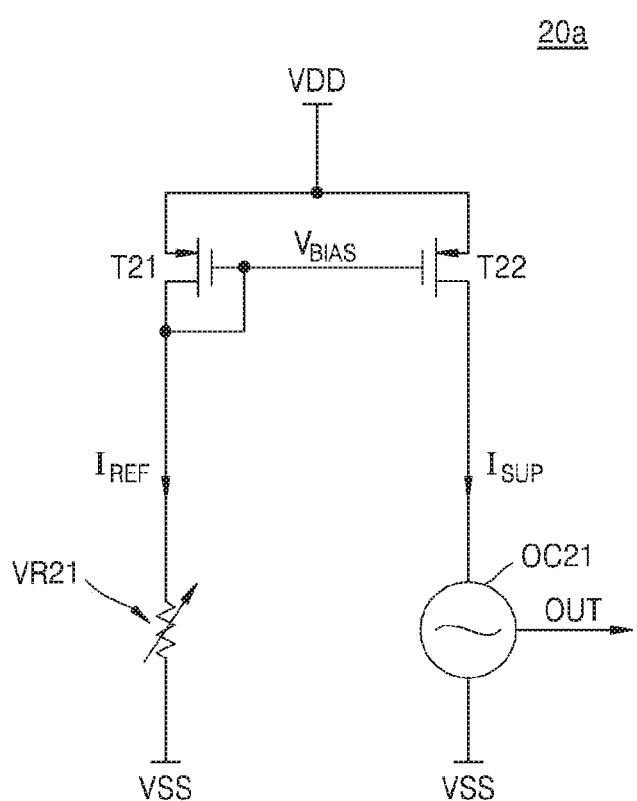
FIGS. 2A and 2B are circuit diagrams of DCOs according to comparative examples.
Figure 2B:
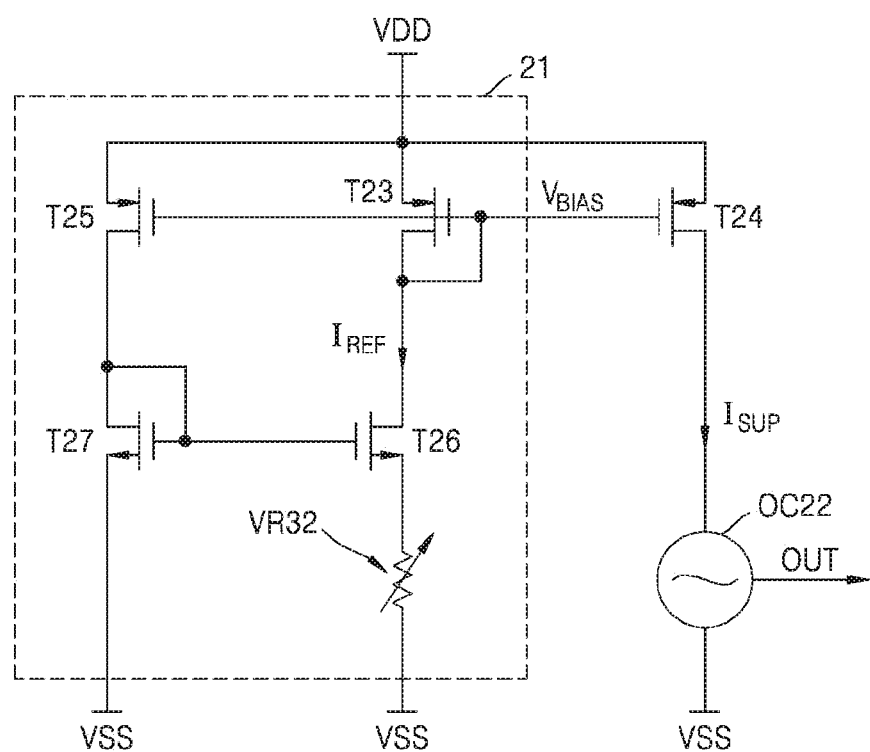

FIGS. 2A and 2B are circuit diagrams of DCOs according to comparative examples. FIG. 2A illustrates a DCO 20a of which the frequency $f_{OUT}$ of an output signal is adjusted according to the resistance of a variable resistor VR21, and FIG. 2B illustrates a DCO 20b of which a PSRR is improved compared to the DCO 20a of FIG. 2A.

Referring to FIG. 2A, the DCO 20a may include transistors T21 and T22 that form a current mirror, a variable resistor VR21 that determines the magnitude of a reference current $I_{REF}$, and an oscillation circuit OC21 that generates an output signal OUT according to a supply current $I_{SUP}$. The transistors T21 and T22, which form the current mirror, may be p-channel field-effect transistors (FETs) and may share a bias voltage $V_{BIAS}$. In the present specification, an FET may be referred to as a transistor, and in some embodiments, the FET may be a metal-oxide-semiconductor field-effect transistor (MOSFET). As the resistance of the variable resistor VR21 decreases, the reference current $I_{REF}$ may increase, and accordingly, the frequency $f_{OUT}$ of the output signal OUT may increase as the supply current $I_{SUP}$ increases. On the other hand, as the resistance of the variable resistor VR21 increases, the reference current $I_{REF}$ may decrease, and accordingly, the frequency $f_{OUT}$ of the output signal OUT may decrease as the supply current $I_{SUP}$ decreases.

The DCO 20a of FIG. 2A may be sensitive to a supply voltage. For example, the bias voltage $V_{BIAS}$ may fluctuate due to the fluctuation of a positive supply voltage VDD, and the reference current $I_{REF}$ may fluctuate as a voltage across the variable resistor VR21 fluctuates. As a result, the frequency $f_{OUT}$ of the output signal OUT may fluctuate due to the variation of the positive supply voltage VDD. As such, the DCO 20a of FIG. 2A may have a low PSRR.

Referring to FIG. 2B, a beta multiplier reference (BMR) may be employed in the DCO 20b of FIG. 2B to solve the low PSRR of the DCO 20a of FIG. 2A. Referring to FIG. 2B, the DCO 20b may include an oscillation circuit OC22 and a p-channel transistor T24 that provides a supply current $I_{SUP}$ to the oscillation circuit OC22, similar to the DCO 20a of FIG. 2A, and may include a BMR structure 21.

The BMR structure 21 may include two p-channel transistors T25 and T23, two n-channel transistors T27 and T26, and a variable resistor VR32. When a reference current $I_{REF}$ increases due to any cause, the voltage of the source of the n-channel transistor T26 may increase by the variable resistor VR32, and accordingly, a gate-source voltage $V_{GS}$ of the n-channel transistor T26 may decrease. A decrease in the gate-source voltage $V_{GS}$ may decrease a drain current (i.e., the reference current $I_{REF}$) of the n-channel transistor T26, and as a result, the BMR structure 21 may provide negative feedback.

The reference current $I_{REF}$ may be stably maintained by the BMR structure 21, but the BMR structure 21 may have poor characteristics, such as high noise sensitivity and high power consumption. For example, when the supply current $I_{SUP}$ is obtained by amplifying a relatively small reference current $I_{REF}$ according to the ratio of the sizes of the two p-channel transistors T23 and T24 forming a current mirror, noise due to the BMR structure 21 may also be amplified, and accordingly, an output signal OUT generated by the oscillation circuit OC22 may be unstable. On the other hand, when employing a relatively large reference current $I_{REF}$, the DCO 20b may have high power consumption due to power consumption by the BMR structure 21. As such, a PSRR and noise characteristics may be in a trade-off relationship, and noise characteristics and power consumption may also be in a trade-off relationship. As discussed below with reference to FIG. 3 and the like, a DCO according to an example embodiment may provide good characteristics, such as a high PSRR, low noise sensitivity, and low power consumption, by solving these trade-off relationships. Moreover, a DCO according to an example embodiment may provide a wide frequency range.

Figure 3:
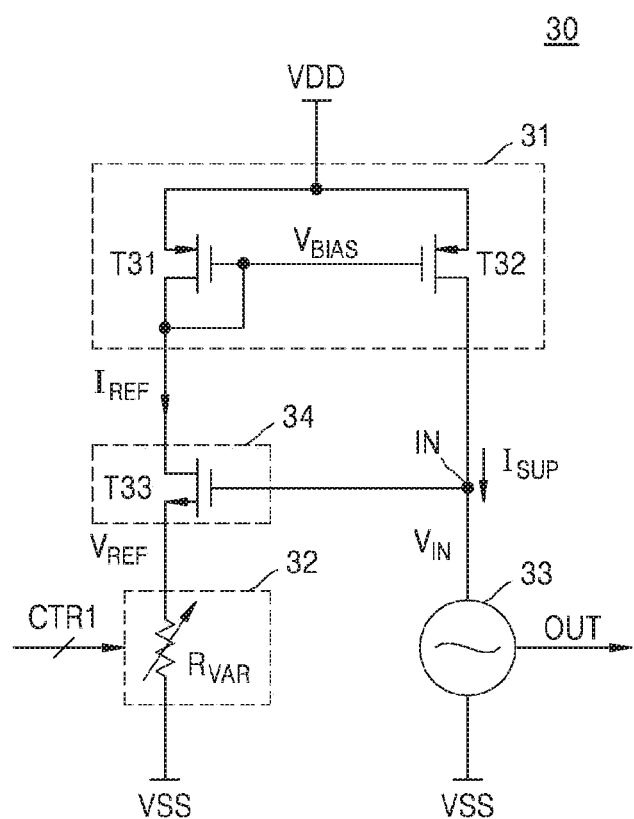
FIG. 3 is a circuit diagram of a DCO according to an example embodiment.

FIG. 3 is a circuit diagram of a DCO 30 according to an example embodiment. As shown in FIG. 3, the DCO 30 may include a current mirror 31, a variable resistor 32, an oscillating circuit 33, and a feedback circuit 34.

Similar to that described above with reference to FIG. 1, the current mirror 31 may generate a supply current $I_{SUP}$ based on a reference current $I_{REF}$ and provide the supply current $I_{SUP}$ to the oscillation circuit 33. The current mirror 31 may include a first transistor T31 and a second transistor T32. The first transistor T31 may generate a bias voltage $V_{BIAS}$ based on the reference current $I_{REF}$, and the second transistor T32 may generate the supply current $I_{SUP}$ based on the bias voltage $V_{BIAS}$. The ratio of the supply current $I_{SUP}$ to the reference current $I_{REF}$ may be determined by the ratio of the size (e.g., channel width) of the second transistor T32 to the size (e.g., channel width) of the first transistor T31.

The oscillation circuit 33 may receive the supply current $I_{SUP}$ through an input node IN and may generate an output signal OUT having a frequency $f_{OUT}$ that varies according to the supply current $I_{SUP}$. As the oscillation circuit 33 receives the supply current $I_{SUP}$, the voltage of the input node IN, that is, an input voltage $V_{IN}$, may be generated. Examples of the oscillation circuit 33 will be described later with reference to FIGS. 4A and 4B.

The variable resistor 32 may provide a resistance $R_{VAR}$ that varies according to a first control signal CTR1 including at least one bit. For example, the variable resistor 32 may include a plurality of resistors and a plurality of switches, and each of the plurality of switches may be turned on or off according to the at least one bit of the first control signal CTR1, and thus, each of the plurality of resistors may be electrically connected or disconnected to both ends of the variable resistor 32. The reference current $I_{REF}$ may pass through the variable resistor 32, and the voltage of a node to which the feedback circuit 34 and the variable resistor 32 are connected, that is, a reference voltage $V_{REF}$, may be determined by the reference current $I_{REF}$ and the resistance $R_{VAR}$ of the variable resistor 32. An example of the variable resistor 32 will be described later with reference to FIGS. 7A and 9A.

The feedback circuit 34 may pass the reference current $I_{REF}$ between the current mirror 31 and the variable resistor 32 and may be connected to the input node IN. The feedback circuit 34 may have a first current carrying terminal electrically coupled to the current mirror 31, a second current carrying terminal electrically coupled to the variable resistor 32 and a control terminal electrically connected to the input node IN. The feedback circuit 34 may control the reference current $I_{REF}$ based on the voltage of the input node IN, that is, the input voltage $V_{IN}$. In some embodiments, the feedback circuit 34 may increase the reference current $I_{REF}$ in response to an increase in the input voltage $V_{IN}$, and may decrease the reference current $I_{REF}$ in response to a decrease in the input voltage $V_{IN}$. Also, in some embodiments, the feedback circuit 34 may decrease the reference current $I_{REF}$ in response to an increase in the reference voltage $V_{REF}$, and may increase the reference current $I_{REF}$ in response to a decrease in the reference voltage $V_{REF}$. For example, when the input voltage $V_{IN}$ increases due to any cause, the reference current $I_{REF}$ may increase by the feedback circuit 34 and the reference voltage $V_{REF}$ may increase due to an increase in the reference current $I_{REF}$. The feedback circuit 34 may decrease the reference current $I_{REF}$ due to an increase in the reference voltage $V_{REF}$, the current mirror 31 may decrease the supply current $I_{SUP}$ according to a decrease in the reference current $I_{REF}$, and the input voltage $V_{IN}$ may decrease according to a decrease in the supply current $I_{SUP}$. As a result, the feedback circuit 34 may provide negative feedback.

In some embodiments, as shown in FIG. 3, the feedback circuit 34 may include a third transistor T33, and the third transistor T33 may be an n-channel transistor. The third transistor T33 may have a drain for receiving the reference current $I_{REF}$ from the current mirror 31, a source for outputting the reference current $I_{REF}$ to the variable resistor 32, and a gate connected to the input node IN. As described above, when the input voltage $V_{IN}$ increases due to any cause, a gate-source voltage $V_{GS}$ of the third transistor T33 may increase and the reference current $I_{REF}$ may increase due to an increase in the gate-source voltage $V_{GS}$. An increase in the reference current $I_{REF}$ may increase the reference voltage $V_{REF}$, and an increase in the reference voltage $V_{REF}$ may decrease the gate-source voltage $V_{GS}$ of the third transistor T33. The reference current $I_{REF}$ may decrease according to a decrease in the gate-source voltage $V_{GS}$, and a decrease in the reference current $I_{REF}$ may decrease the supply current $I_{SUP}$. As a result, as the input voltage $V_{IN}$ decreases according to a decrease in the supply current $I_{SUP}$, negative feedback may be provided. As another example, when the reference current $I_{REF}$ increases due to any cause, the reference voltage $V_{REF}$ may increase due to an increase in the reference current $I_{REF}$. The gate-source voltage $V_{GS}$ of the third transistor T33 may decrease according to an increase in the reference voltage $V_{REF}$, and the reference current $I_{REF}$ may decrease according to a decrease in the gate-source voltage $V_{GS}$ and thus negative feedback may be provided.

As described above, similar to the BMR structure 21 of FIG. 2B, the feedback circuit 34 may provide an improved PSRR. However, the BMR structure 21 of FIG. 2B may include an additional path of current flowing from the positive supply voltage VDD to a negative supply voltage VSS through the p-channel transistor T25 and the n-channel transistor T27, while the feedback circuit 34 of FIG. 3 may be placed on a path, through which the reference current $I_{REF}$ flows, and accordingly an additional current path may be omitted, and thus, the DCO 30 of FIG. 3 may have lower power consumption than the DCO 20b of FIG. 2B.

Figure 4A:
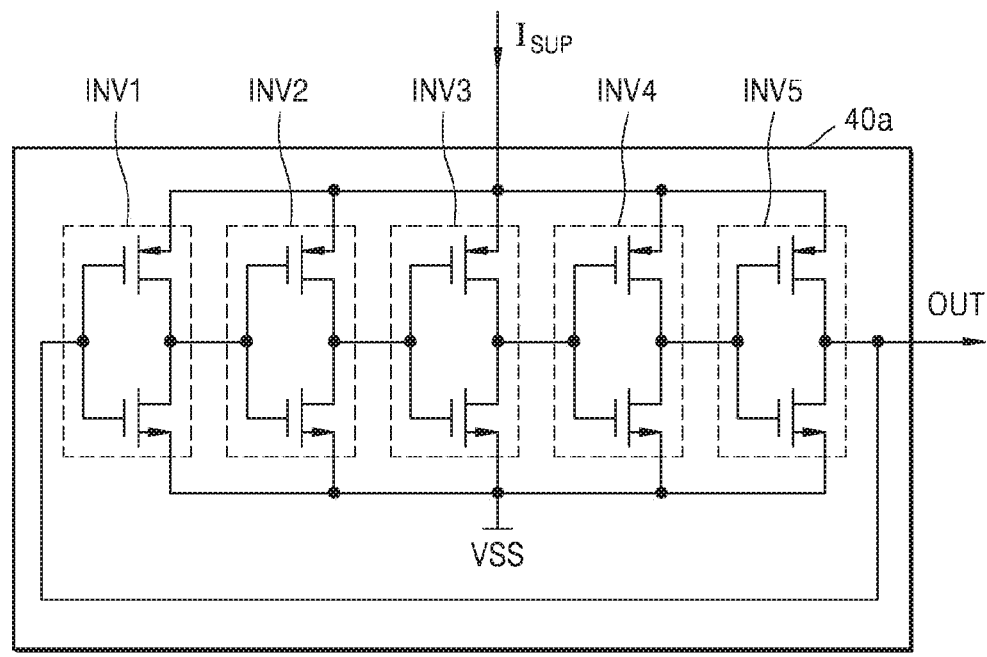
FIG. 4A is a circuit diagram of an oscillation circuit according to an example embodiment.
Figure 4B:
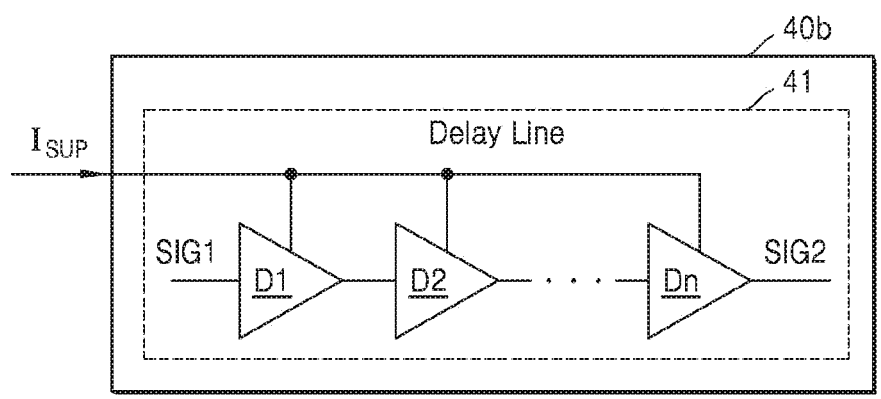
FIG. 4B is a block diagram of an oscillation circuit according to an example embodiment.

FIG. 4A is a circuit diagram of an oscillation circuit 40a according to an example embodiment, and FIG. 4B is a block diagram of an oscillation circuit 40b according to an example embodiment. As described above with reference to FIG. 1, the oscillation circuits 40a and 40b of FIGS. 4A and 4B may generate an output signal OUT having a frequency that varies according to a supply current $I_{SUP}$. It will be understood that the example embodiments may also be applied to an oscillation circuit that is different from the oscillation circuits 40a and 40b of FIGS. 4A and 4B.

Referring to FIG. 4A, the oscillation circuit 40a may include a ring oscillator. As shown in FIG. 4A, the oscillation circuit 40a may include a chain of inverters INV1 to INV5, and each of the plurality of inverters INV1 to INV5 may receive a supply current $I_{SUP}$. Each of the plurality of inverters INV1 to INV5 may provide a delay that varies according to the supply current $I_{SUP}$, and accordingly, the output signal OUT may have a frequency $f_{OUT}$ that varies according to the supply current $I_{SUP}$. In the example of FIG. 4A, the oscillation circuit 40a includes five inverters INV1 to INV5. However, in some other embodiments, the oscillation circuit 40a may include an odd number of inverters unequal to five (e.g., 3, 7, 9, 11, . . . ).

Referring to FIG. 4B, the oscillation circuit 40b may include a delay line 41. For example, the delay line 41 may be included in a delayed-locked loop (DLL). As shown in FIG. 4B, the delay line 41 may include a plurality of delay cells D1, D2, . . . , Dn (where n is an integer greater than 2) and each of the plurality of delay cells D1, D2, . . . , Dn may receive a supply current $I_{SUP}$. Each of the plurality of delay cells D1, D2, . . . , Dn may provide a delay that varies according to the supply current $I_{SUP}$, and accordingly, a second signal SIG2 may be variably delayed from a first signal SIG1.

Figure 5:
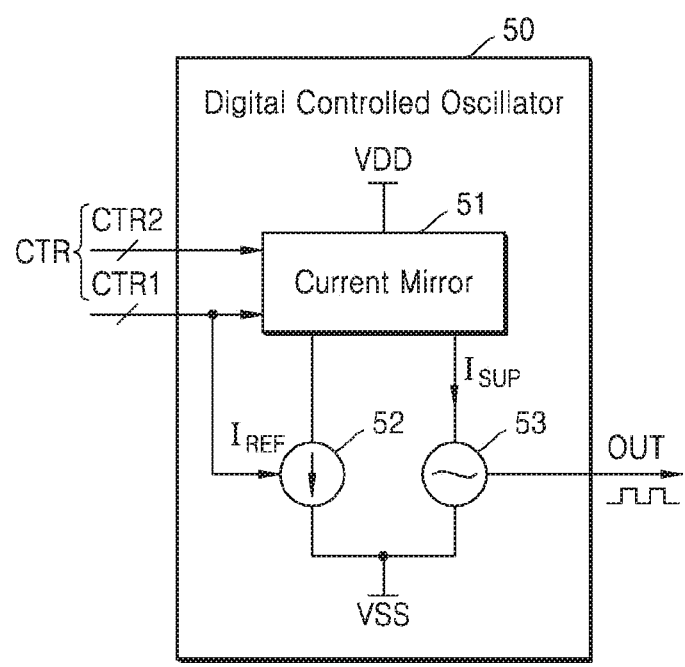
FIG. 5 is a block diagram of a DCO according to an example embodiment.

FIG. 5 is a block diagram of a DCO 50 according to an example embodiment. The DCO 50 may receive a control signal CTR including a first control signal CTR1 and a second control signal CTR2 and may generate a frequency $f_{OUT}$ that varies according to the control signal CTR. As shown in FIG. 5, the DCO 50 may include a current mirror 51, a current source 52, and an oscillation circuit 53. Hereinafter, the description of FIG. 5, which is the same as the description of FIG. 1, will be omitted.

Referring to FIG. 5, the first control signal CTR1 may include at least one bit and may be commonly provided to the current mirror 51 and the current source 52. Furthermore, the second control signal CTR2 including at least one bit may be provided to the current mirror 51. The current mirror 51 and the current source 52 may determine the magnitude of a reference current $I_{REF}$ based on the first control signal CTR1, and the current mirror 51 may determine the magnitude of a supply current $I_{SUP}$ based on the second control signal CTR2 and the reference current $I_{REF}$.

In some embodiments, the first control signal CTR1 may be used to coarsely adjust the frequency $f_{OUT}$ of an output signal OUT, and the second control signal CTR2 may be used to finely adjust the frequency $f_{OUT}$ of the output signal OUT. As described below with reference to FIG. 10 and the like, as the first control signal CTR1 is provided not only to the current source 52 but also to the current mirror 51, the reference current $I_{REF}$ may increase or decrease according to a convex function instead of linearly increasing or decreasing according to the first control signal CTR1. Accordingly, a variable range of the reference current $I_{REF}$ according to the first control signal CTR1 may be expanded, and consequently a variable range of the frequency $f_{OUT}$ of the output signal OUT may also be expanded.

Figure 6:
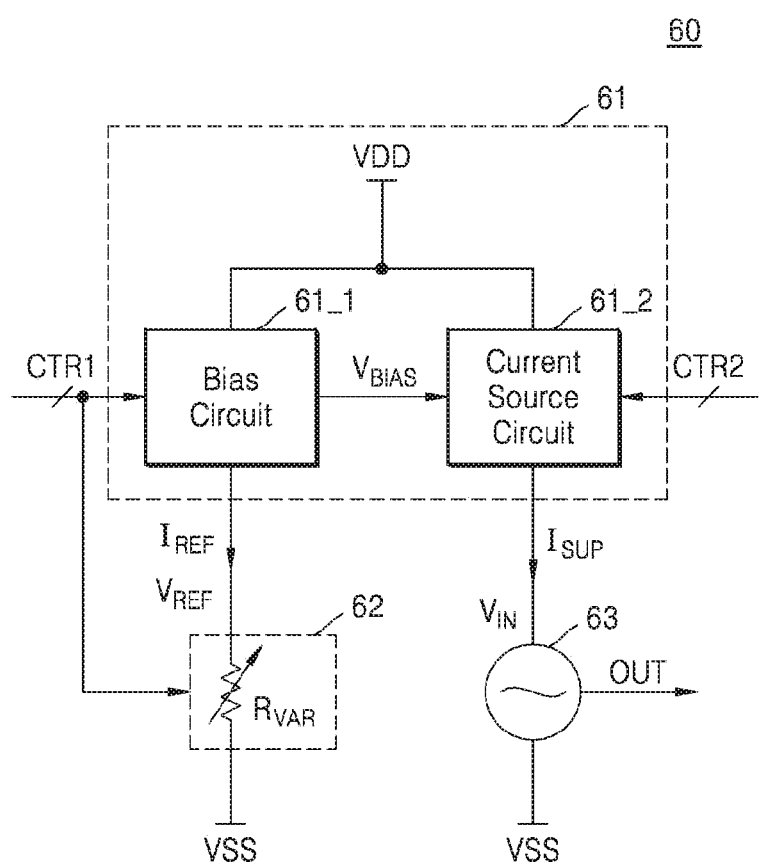
FIG. 6 is a block diagram of a DCO according to an example embodiment.

FIG. 6 is a block diagram of a DCO 60 according to an example embodiment. Similar to that described above with reference to FIG. 5, the DCO 60 of FIG. 6 may receive a first control signal CTR1 and a second control signal CTR2 and may generate an output signal OUT having a frequency $f_{OUT}$ that varies according to the first control signal CTR1 and the second control signal CTR2. As shown in FIG. 6, the DCO 60 may include a current mirror 61, a variable resistor 62, and an oscillation circuit 63.

The current mirror 61 may receive the first control signal CTR1 in common with the variable resistor 62 and may receive the second control signal CTR2. The magnitude of a first reference current $I_{REF}$ may be determined according to the first control signal CTR1 and the magnitude of a supply current $I_{SUP}$ may be determined according to the reference current $I_{REF}$ and the second control signal CTR2. As shown in FIG. 6, the current mirror 61 may include a bias circuit 61_1 and a current source circuit 61_2.

The bias circuit 61_1 may receive the first control signal CTR1, may provide the reference current $I_{REF}$ from a positive supply voltage VDD, and may generate a bias voltage $V_{BIAS}$ based on the first control signal CTR1 and the reference current $I_{REF}$. For example, when the current source circuit 61_2 outputs a supply current $I_{SUP}$ that decreases in response to in an increase in the bias voltage $V_{BIAS}$, the bias circuit 61_1 may decrease the bias voltage $V_{BIAS}$ in response to the first control signal CTR1 that decreases a resistance $R_{VAR}$ of the variable resistor 62. Also, the bias circuit 61_1 may increase the bias voltage $V_{BIAS}$ in response to the first control signal CTR1 that increases the resistance $R_{VAR}$ of the variable resistor 62. An example of the bias circuit 61_1 will be described later with reference to FIG. 7B.

The current source circuit 61_2 may generate the supply current $I_{SUP}$ based on the bias voltage $V_{BIAS}$ and the second control signal CTR2. For example, the current source circuit 61_2 may increase the supply current $I_{SUP}$ in response to a decrease in the bias voltage $V_{BIAS}$. In some embodiments, the current source circuit 61_2 may generate a supply current $I_{SUP}$ having a magnitude proportional to or inversely proportional to the value of the second control signal CTR2. An example of the current source circuit 61_2 will be described later with reference to FIG. 11.

The variable resistor 62 may provide a resistance $R_{VAR}$ that varies according to the first control signal CTR1 including at least one bit. In some embodiments, the variable resistor 62 may provide a resistance $R_{VAR}$ that decreases as the value of the first control signal CTR1 increases. For example, the resistance $R_{VAR}$ of the variable resistor 62 may be inversely proportional to the value of the control signal CTR1. The reference current $I_{REF}$ may increase when the resistance $R_{VAR}$ of the variable resistor 62 decreases according to the first control signal CTR1, while the reference current $I_{REF}$ may decrease when the resistance $R_{VAR}$ of the variable resistor 62 increases according to the first control signal CTR1.

Figure 7A:
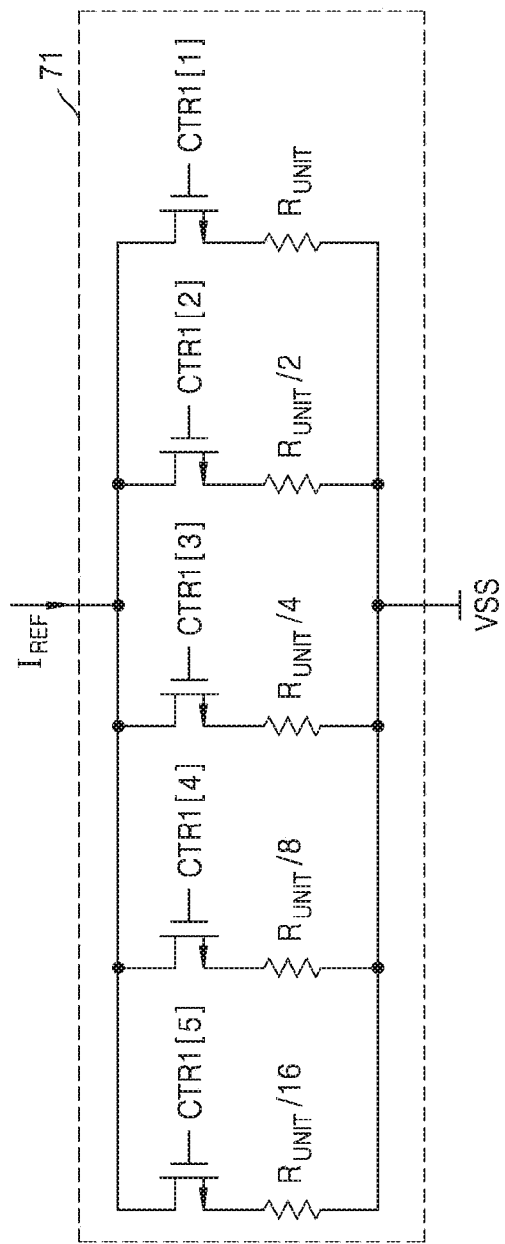
FIGS. 7A and 7B are circuit diagrams illustrating examples of a variable resistor and a bias circuit in FIG. 6, respectively, according to example embodiments.
Figure 7B:
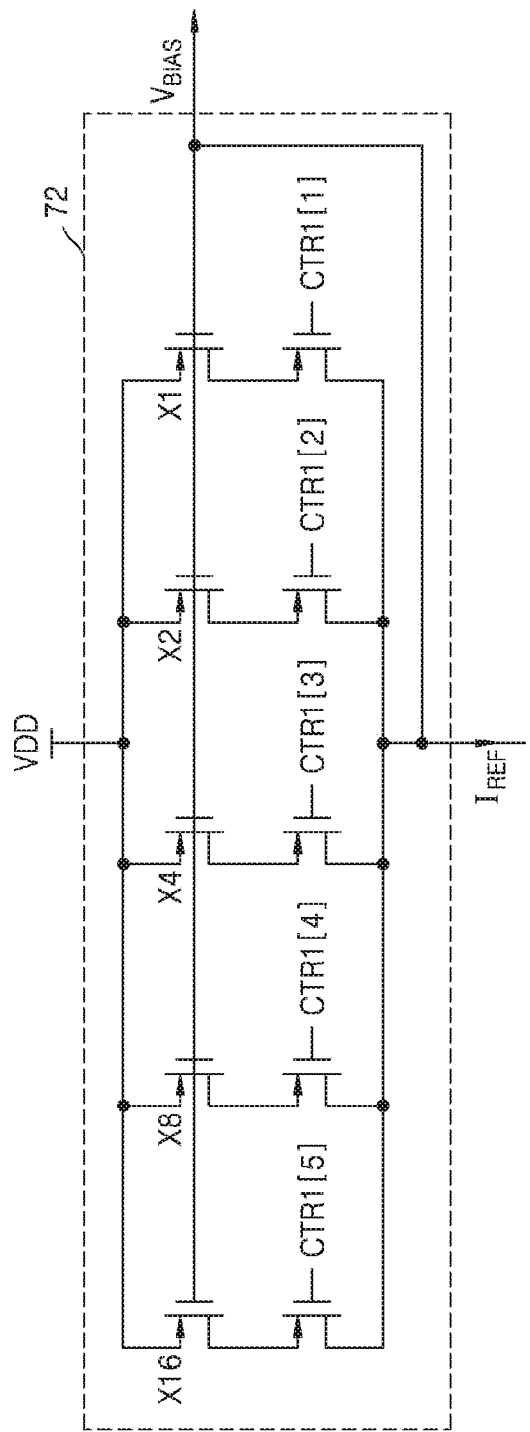

FIGS. 7A and 7B are circuit diagrams illustrating examples of the variable resistor 62 and the bias circuit 61_1 in FIG. 6, respectively, according to example embodiments. As described above with reference to FIG. 6, a variable resistor 71 of FIG. 7A may provide the resistance $R_{VAR}$ that varies according to the first control signal CTR1, and a bias circuit 72 of FIG. 7B may generate the bias voltage $V_{BIAS}$ based on the first control signal CTR1 and the reference current $I_{REF}$. Hereinafter, FIGS. 7A and 7B will be described with reference to FIG. 6. In the examples of FIGS. 7A and 7B, the first control signal CTR1 includes 5 bits. However, it will be understood that example embodiments are not limited thereto. Furthermore, in the present specification, it is assumed that the value "1" of a bit corresponds to a high level voltage and the value "0" of the bit corresponds to a low level voltage.

As shown in FIG. 7A, the variable resistor 71 may include a plurality of n-channel transistors and a plurality of resistors. The plurality of n-channel transistors may each have a gate receiving one bit of the first control signal CTR1 and may be connected to the plurality of resistors, respectively. When one bit of the first control signal CTR1 is "1", an n-channel transistor may be turned on and a resistor connected in series to the n-channel transistor may be electrically connected to both ends of the variable resistor 71.

The variable resistor 71 may selectively provide $2^{1-k}$ times a unit resistance $R_{UNIT}$ between the current mirror 61 and the negative supply voltage VSS according to a k-th bit CTR1[k] of the first control signal CTR1 (where k is a positive integer). For example, when the k-th bit CTR1[k] of the first control signal CTR1 is "1", a resistor having a resistance of "$R_{UNIT}/2^{k-1}$" may be electrically connected to both ends of the variable resistor 71. For example, when a second bit CTR1[2] of the first control signal CTR1 is "1", a resistor having a resistance of "$R_{UNIT}/2$" may be electrically connected to both ends of the variable resistor 71. Accordingly, the resistance $R_{VAR}$ of the variable resistor 71 of FIG. 7A may be inversely proportional to the value of the first control signal CTR1 and may be expressed by Equation 1.

$$R_{VAR} = \frac{R_{UNIT}}{CTR1} \quad [\text{Equation 1}]$$

The reference current $I_{REF}$ may be expressed by Equation 2.

$$I_{REF} = \frac{V_{REF}}{R_{VAR}} = \frac{V_{REF}}{R_{UNIT}} CTR1 \quad [\text{Equation 2}]$$

Referring to FIG. 7B, the bias circuit 72 may include a plurality of p-channel transistors. The plurality of p-channel transistors may include p-channel transistors each having a gate receiving one bit of the first control signal CTR1 and p-channel transistors each having a gate to which the bias voltage $V_{BIAS}$ is applied. When one bit of the first control signal CTR1 is "0", a p-channel transistor may be turned on and a p-channel transistor connected in series to the turned-on p-channel transistor may be enabled.

The bias circuit 72 may enable or disable a p-channel transistor having $2^{k-1}$ times a unit size according to the k-th bit CTR1[k] of the first control signal CTR1. The enabled p-channel transistor may pass at least a portion of the reference current $I_{REF}$ and may contribute to the generation of the bias voltage $V_{BIAS}$. For example, when the k-th bit CTR1[k] of the first control signal CTR1 is "0", a p-channel transistor having a magnitude of "$2^{k-1} \times 1$" may be enabled. The size of the p-channel transistor may correspond to a p-channel width, and the larger the size of the p-channel transistor, the higher the current driving capability of the p-channel transistor may be. For example, when the second bit CTR1[2] of the first control signal CTR1 is "0", a p-channel transistor having the size of "×2" may be enabled. Accordingly, the supply current $I_{SUP}$ may be expressed by Equation 3.

$$I_{SUP} = \frac{A}{31 - CTR1} I_{REF} \quad \text{[Equation 3]}$$

In Equation 3, "A" may correspond to the size of a p-channel transistor enabled in the current source circuit 61_2. The frequency $f_{OUT}$ of the output signal OUT may be expressed by Equation 4, according to Equations 1, 2, and 3.

$$f_{OUT} = K \cdot I_{SUP} = K \cdot A \cdot \frac{V_{REF}}{R_{UNIT}} \cdot \frac{CTR1}{31 - CTR1} \quad \text{[Equation 4]}$$

In Equation 4, "K" may be a constant depending on the oscillation circuit 63. The frequency $f_{OUT}$ (hereinafter, referred to as output frequency $f_{OUT}$) of the output signal OUT may be defined as a function for the first control signal CTR1, and the function may be a convex function that monotonously increases. Accordingly, a variable range of the output frequency $f_{OUT}$ may be expanded, as described below with reference to FIG. 10.

Figure 8:
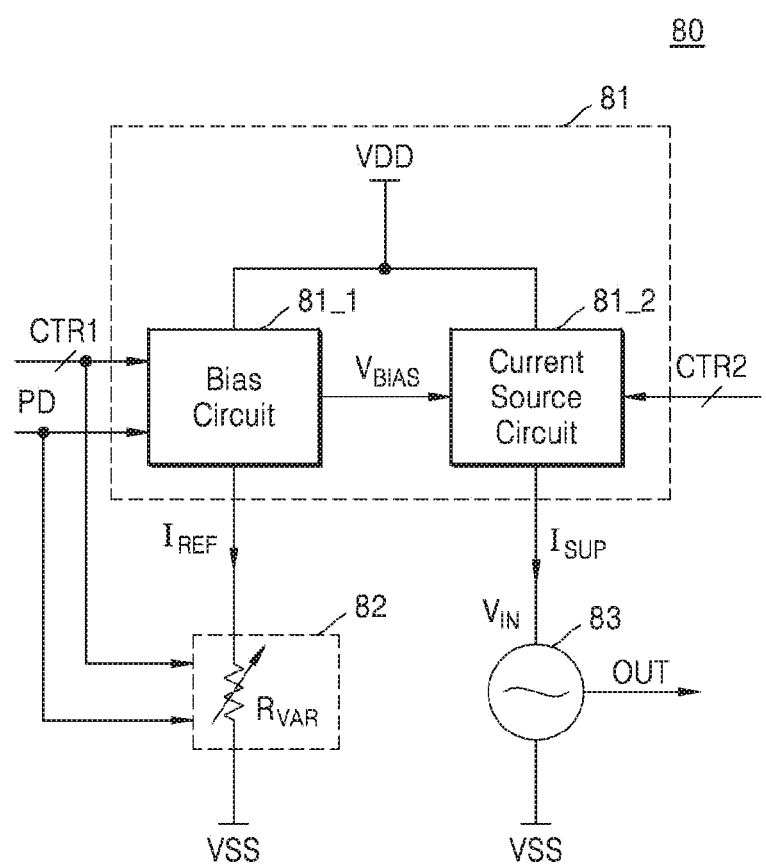
FIG. 8 is a block diagram of a DCO according to an example embodiment.

FIG. 8 is a block diagram of a DCO 80 according to an example embodiment. Specifically, when compared with the DCO 80 of FIG. 6, the DCO 80 of FIG. 8 may receive a control signal CTR including a power-down signal PD as well as a first control signal CTR1 and the second control signal CTR2. As shown in FIG. 8, the DCO 80 may include a current mirror 81, a variable resistor 82, and an oscillation circuit 83. Hereinafter, the description of FIG. 8 which is the same as the description of FIG. 6 will be omitted.

The current mirror 81 may include a bias circuit 81_1 and a current source circuit 81_2, and the bias circuit 81_1 may receive a first control signal CTR1 and a power-down signal PD in common with the variable resistor 82. In the examples of FIGS. 7A and 7B, when the value of the first control signal CTR1 is a minimum value, that is, "00000", the resistance $R_{VAR}$ of the variable resistor 71 of FIG. 7A may be approximately infinite. When the value of the first control signal CTR1 is a maximum value, that is, "11111", the bias circuit 72 of FIG. 7B may block the reference current $I_{REF}$. Unlike the examples of FIGS. 7A and 7B, in order to generate the reference current $I_{REF}$ even if the value of the first control signal CTR1 is the minimum value or the maximum value and to block power consumption when the DCO is not used, the DCO 80 of FIG. 8 may additionally receive the power-down signal PD. For example, when the value of the first control signal CTR1 is zero and the power-down signal PD is inactive (e.g., the power-down signal PD has a value of "0"), the resistance $R_{VAR}$ of the variable resistor 82 may have a maximum value so that the reference current $I_{REF}$ has a minimum value. On the other hand, when the value of the first control signal CTR1 is zero and the power-down signal PD is active (e.g., the power-down signal PD has a value of "1"), the resistance $R_{VAR}$ of the variable resistor 82 may be approximately infinite.

Figure 9A:
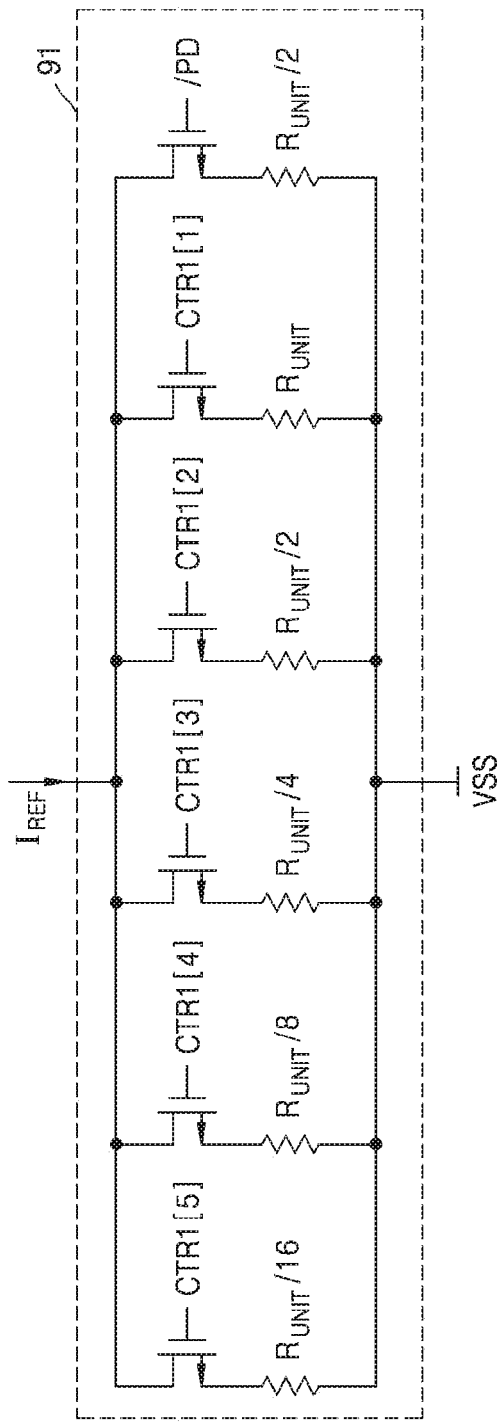
FIGS. 9A and 9B are circuit diagrams illustrating examples of a variable resistor and a bias circuit in FIG. 8, respectively, according to example embodiments.
Figure 9B:
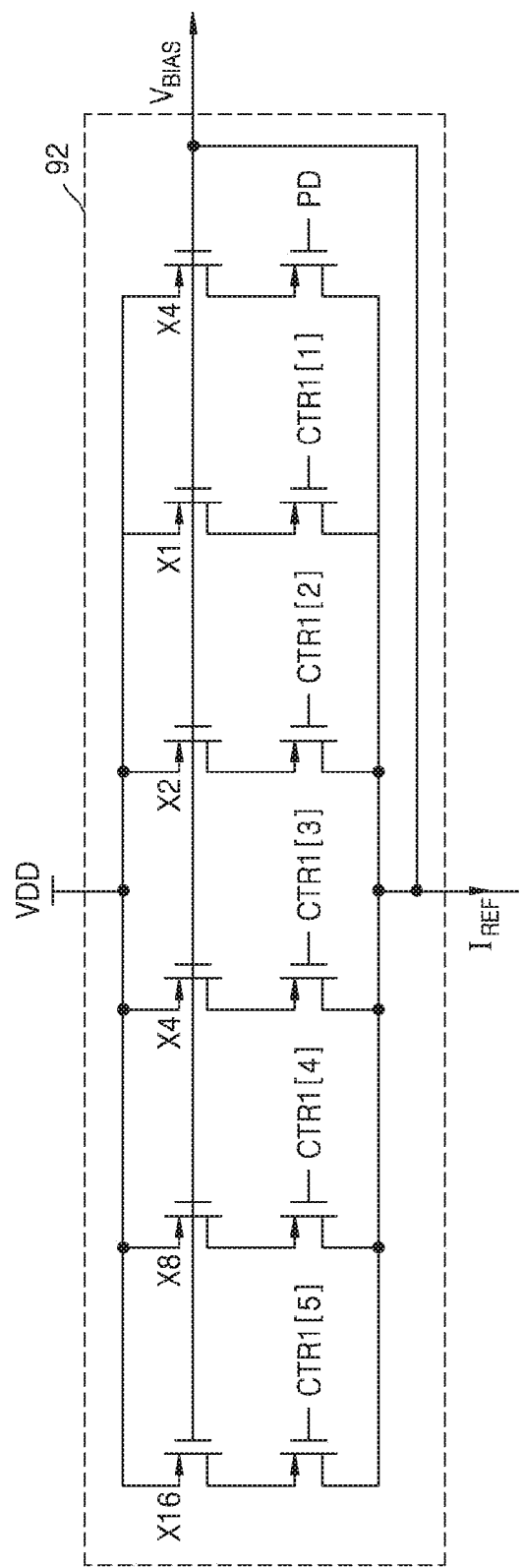

FIGS. 9A and 9B are circuit diagrams illustrating examples of the variable resistor 82 and the bias circuit 81_1 in FIG. 8, respectively, according to example embodiments. As described above with reference to FIG. 8, a variable resistor 91 of FIG. 9A may provide a resistance $R_{VAR}$ that varies according to the first control signal CTR1, and a bias circuit 92 of FIG. 9B may generate a bias voltage $V_{BIAS}$ based on the control signal CTR1 and the reference current $I_{REF}$. Hereinafter, FIGS. 9A and 9B will be described with reference to FIG. 8, and the descriptions of FIGS. 9A and 9B which overlap with the descriptions of FIGS. 7A and 7B will be omitted. In the examples of FIGS. 9A and 9B, the first control signal CTR1 includes 5-bits. However, it will be understood that example embodiments are not limited thereto.

Referring to FIG. 9A, when compared with the variable resistor 71 of FIG. 7A, the variable resistor 91 may further include n-channel transistors receiving an inverted power-down signal /PD and resistors connected in series to the n-channel transistors. Accordingly, even when the first control signal CTR1 is zero, when the power-down signal PD is active, that is, when the inverted power-down signal /PD is "1", an n-channel transistor may be turned on and a resistance "$R_{UNIT}/2$" of a resistor connected to the n-channel transistor may be electrically connected to both ends of the variable resistor 91. Accordingly, the resistance $R_{VAR}$ of the variable resistor 91 of FIG. 9A may be expressed by Equation 5.

$$R_{VAR} = \frac{R_{UNIT}}{CTR1 + 2} \quad \text{[Equation 5]}$$

In addition, the reference current $I_{REF}$ may be expressed by Equation 6.

$$I_{REF} = \frac{V_{REF}}{R_{VAR}} = \frac{V_{REF}}{R_{UNIT}}(CTR1 + 2) \quad \text{[Equation 6]}$$

Referring to FIG. 9B, when compared with the bias circuit 72 of FIG. 7B, the bias circuit 92 may further include a p-channel transistor receiving the power-down signal PD, and another p-channel transistor connected in series to the p-channel transistor and to which the bias voltage $V_{BIAS}$ is applied. Accordingly, even when the first control signal CTR1 has a maximum value, that is, "11111", the bias circuit 92 may pass the reference current $I_{REF}$ due to a power-down signal PD having a value of "1". Accordingly, the supply current $I_{SUP}$ may be expressed by Equation 7.

$$I_{SUP} = \frac{A}{35 - CTR1} I_{REF} \quad \text{[Equation 7]}$$

In Equation 7, "A" may correspond to the size of a p-channel transistor enabled in the current source circuit 81_2. The output frequency $f_{OUT}$ may be expressed by Equation 8, according to Equations 5, 6, and 7.

$$f_{OUT} = K \cdot I_{SUP} = K \cdot A \cdot \frac{V_{REF}}{R_{UNIT}} \cdot \frac{CTR1 + 2}{35 - CTR1} \quad \text{[Equation 8]}$$

In Equation 8, "K" may be a constant depending on the oscillation circuit 63. As in Equation 8, the output frequency $f_{OUT}$ may be defined as a function for the first control signal CTR1, and the function may be a convex function that monotonously increases.

Figure 10:
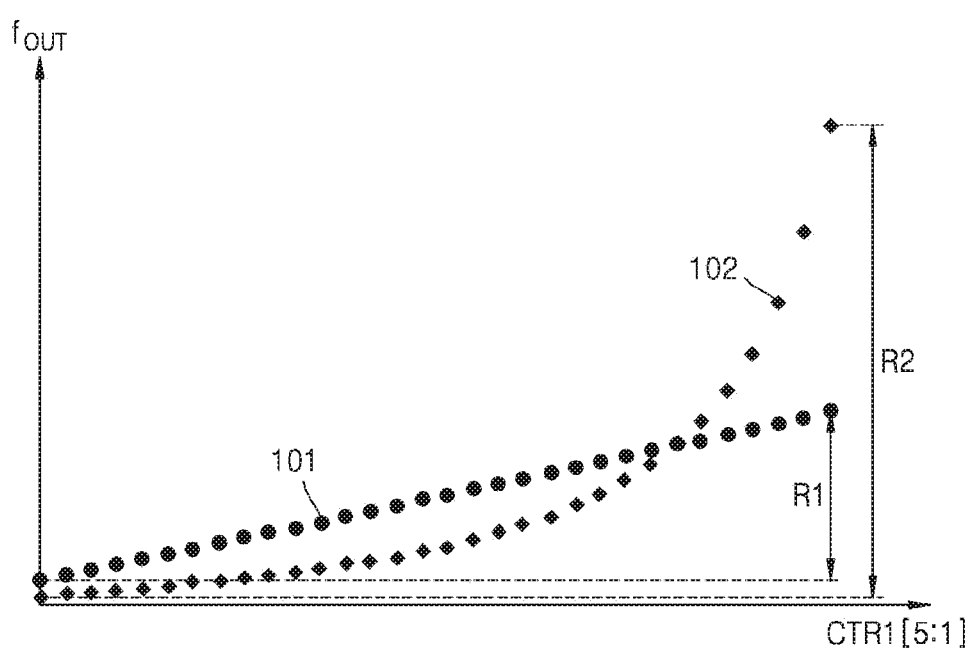
FIG. 10 is a graph showing a relationship between a first control signal and an output frequency according to an example embodiment.

FIG. 10 is a graph showing a relationship between the first control signal CTR1 and the output frequency $f_{OUT}$ according to an example embodiment. Specifically, the graph shows the relationship between the first control signal CTR1 and the output frequency $f_{OUT}$ with respect to each of a case where the output frequency $f_{OUT}$ is determined only by a variable resistor controlled by the first control signal CTR1 and a case where the DCO 80 of FIG. 8 includes the variable resistor 91 of FIG. 9A and the bias circuit 92 of FIG. 9B.

As shown by a circular mark 101 in FIG. 10, when the output frequency $f_{OUT}$ depends only on the resistance of a variable resistor, the first control signal CTR1 and the output frequency $f_{OUT}$ may have a linear relationship and the output frequency $f_{OUT}$ may vary in a first range R1. On the other hand, when the output frequency $f_{OUT}$ depends on the bias circuit 92 as well as the variable resistor 91, that is, when the output frequency $f_{OUT}$ is defined as a function of the first control signal CTR1 having the value of the first control signal CTR1 as an argument, as in Equation 8, the defined function may be a convex function that monotonously increases, as shown by a rhomboid mark 102 in FIG. 10. That is, in the case of the circular mark 101, the output frequency $f_{OUT}$ may constantly increase as the value of the first control signal CTR1 increases, while in the case of the rhomboid mark 102, the output frequency $f_{OUT}$ may increase such that the increase rate is approximately constant. Accordingly, the output frequency $f_{OUT}$ may be varied in a second range R2, which is greater than the first range R1, and consequently the variable range of the output frequency $f_{OUT}$ may be expanded.

Figure 11:
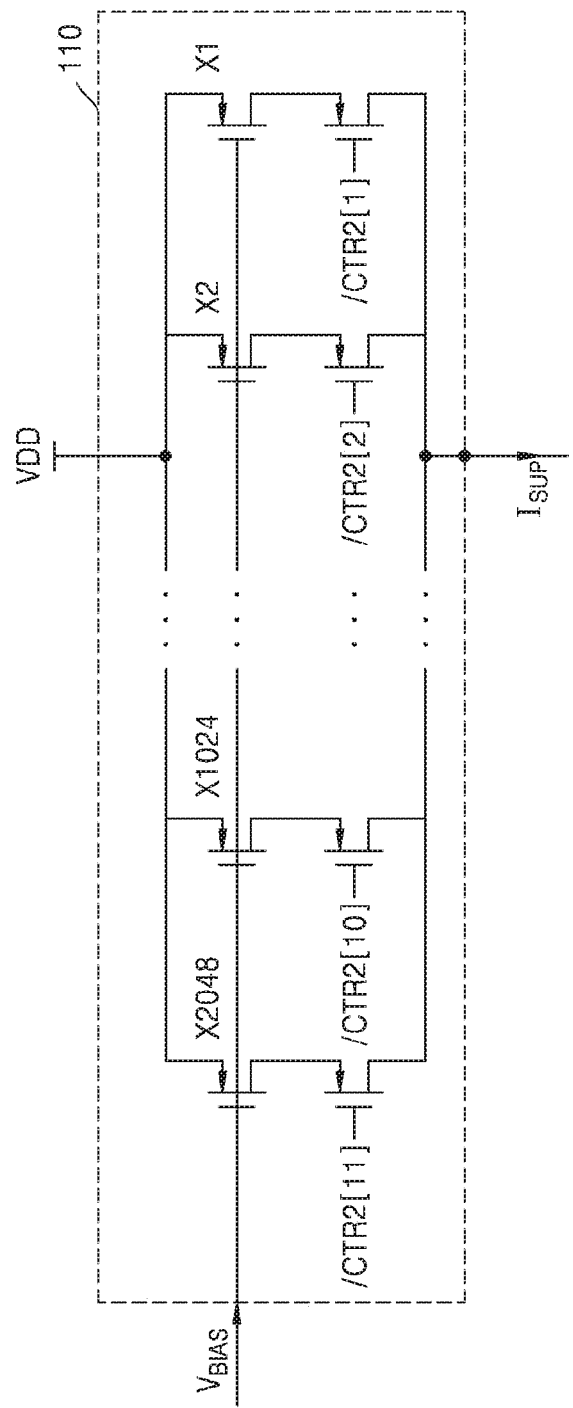
FIG. 11 is a circuit diagram illustrating an example of a current source circuit according to an example embodiment.

FIG. 11 is a circuit diagram illustrating an example of a current source circuit according to an example embodiment. Specifically, FIG. 11 illustrates an example of the current source circuit 61_2 of FIG. 6 or the current source circuit 81_2 of FIG. 8. As described above with reference to FIG. 6, the current source circuit 110 of FIG. 11 may generate a supply current $I_{SUP}$ based on a bias voltage $V_{BIAS}$ and a second control signal CTR2. The current source circuit 110 of FIG. 11 may receive an inverted second control signal /CTR2. Although in FIG. 11 the inverted second control signal /CTR2 includes 11 bits, it will be understood that example embodiments are not limited thereto.

Referring to FIG. 11, the current source circuit 110 may enable or disable a p-channel transistor having $2^k$ times a unit size according to a k-th bit CTR2[k] of the second control signal CTR2. The enabled p-channel transistor may pass at least a portion of the supply current $I_{SUP}$ according to the bias voltage $V_{BIAS}$. For example, when the k-th bit CTR2[k] of the second control signal CTR2 is "1", a k-th bit /CTR2[k] of the inverted second control signal /CTR2 may be "0", and a p-channel transistor having a size of "$2^k \times 1$" may be enabled. Accordingly, "A" in the Equation 3 may be replaced with "CTR2" which is the value of the second control signal CTR2, and the output frequency $f_{OUT}$ may be expressed by Equation 9, according to Equation 4.

$$f_{OUT} = K \cdot \frac{V_{REF}}{R_{UNIT}} \cdot \frac{CTR1}{31 - CTR1} \cdot CTR2 \qquad \text{[Equation 9]}$$

Similarly, in Equation 7, "A" may be replaced by "CTR2", and the output frequency $f_{OUT}$ may be expressed by Equation 10, according to Equation 8.

$$f_{OUT} = K \cdot \frac{V_{REF}}{R_{UNIT}} \cdot \frac{CTR1 + 2}{35 - CTR1} \cdot CTR2 \qquad \text{[Equation 10]}$$

Figure 12:
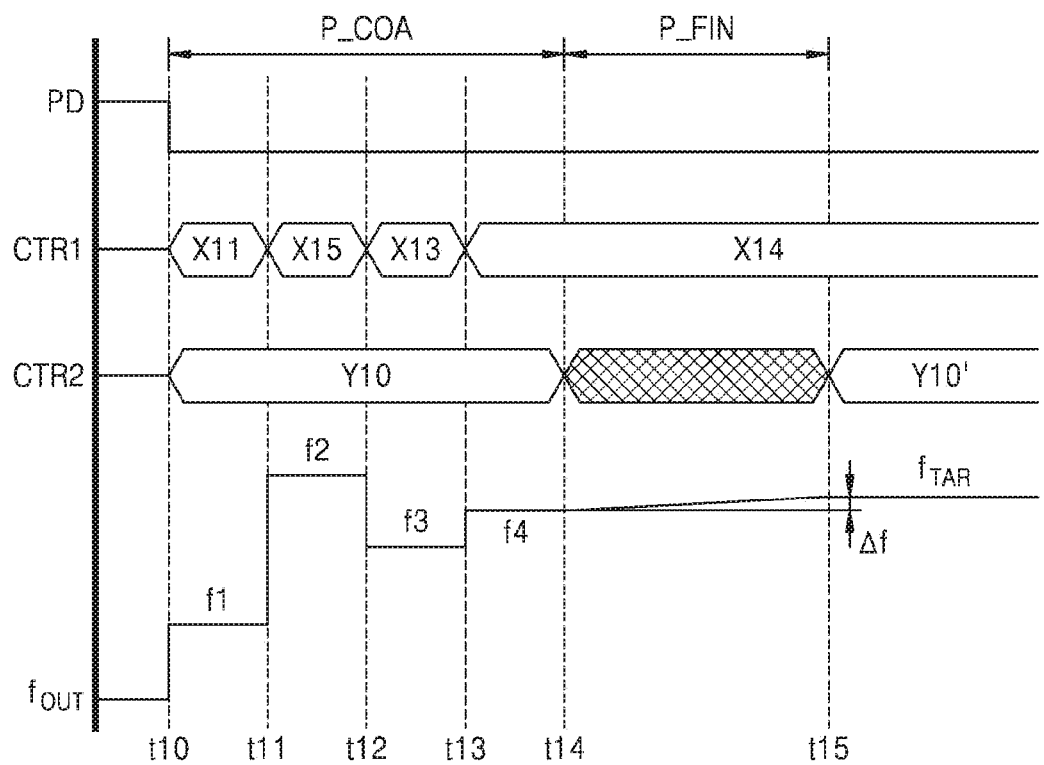
FIG. 12 is a timing diagram illustrating an example in which the output frequency of a DCO is adjusted according to an example embodiment.

FIG. 12 is a timing diagram illustrating an example in which the output frequency of a DCO is adjusted according to an example embodiment. Specifically, FIG. 12 illustrates an example of adjusting the frequency (i.e. the output frequency $f_{OUT}$) of the output signal OUT generated by the DCO 80 of FIG. 8. In FIG. 12, an activated signal may be at a high level, while a deactivated signal may be at a low level. Hereinafter, FIG. 12 will be described with reference to FIG. 8.

Referring to FIG. 12, the power-down signal PD may be deactivated until time t10. That is, until time t10, the DCO 80 may be set to a low power mode and the output signal OUT may not oscillate. At time t10, the power-down signal PD may be activated and a coarse adjustment period P_COA may start. The value of the second control signal CTR2 may be fixed in the coarse adjustment period P_COA, while the value of the first control signal CTR1 may be adjusted such that the output signal OUT has an output frequency $f_{OUT}$ adjacent to a target frequency $f_{TAR}$. For example, as shown in FIG. 12, the second control signal CTR2 may be maintained at a value "Y10" in the coarse adjustment period P_COA, i.e., from time t10 to time t14, while the first control signal CTR1 may have a value "X11" at time t10. The output frequency $f_{OUT}$ may be a first frequency f1 according to the value "X11" of the first control signal CTR1 and the value "Y10" of the second control signal CTR2.

At time t11, the value of the first control signal CTR1 may be changed to "X15" and the output frequency $f_{OUT}$ may be changed to a second frequency f2. At time t12, the value of the first control signal CTR1 may be changed to "X13" and the output frequency $f_{OUT}$ may be changed to a third frequency f3. At time t13, the value of the first control signal CTR1 may be changed to "X14" and the output frequency $f_{OUT}$ may be changed to a fourth frequency f4 adjacent to the target frequency $f_{TAR}$. In some embodiments, coarse adjustment through binary search may be performed in the coarse adjustment period P_COA, as shown in FIG. 12. However, a search technique shown in FIG. 12 is only an example, and the output frequency $f_{OUT}$ may be adjusted adjacent to the target frequency $f_{TAR}$ in the coarse adjustment period P_COA via any search method.

At time t14, the coarse adjustment period P_COA may be ended, while a fine adjustment period P_FIN may start. In the fine adjustment period P_FIN, the value of the first control signal CTR1 may be maintained at the value "X14" determined in the coarse adjustment period P_COA and the value of the second control signal CTR2 may be repeatedly changed such that the output frequency $f_{OUT}$ reaches the target frequency $f_{TAR}$. For example, as shown in FIG. 12, the value "Y10" of the second control signal CTR2 in the coarse adjustment period P_COA may correspond to a minimum value of the second control signal CTR2, and the value of the second control signal CTR2 in the fine adjustment period P_FIN may gradually increase, and thus the output frequency $f_{OUT}$ may also increase.

At time t15, the output frequency $f_{OUT}$ may reach the target frequency $f_{TAR}$ and the fine adjustment period P_FIN may be ended. In some embodiments, as described below with reference to FIG. 16, when the output frequency $f_{OUT}$ fails to reach the target frequency $f_{TAR}$ in the fine adjustment period P_FIN, the coarse adjustment period P_COA may start again and the output frequency $f_{OUT}$ may be set to a frequency adjacent to the target frequency $f_{TAR}$ as a frequency different from the fourth frequency f4, that is, a frequency set in the previous coarse adjustment period P_COA.

Figure 13:
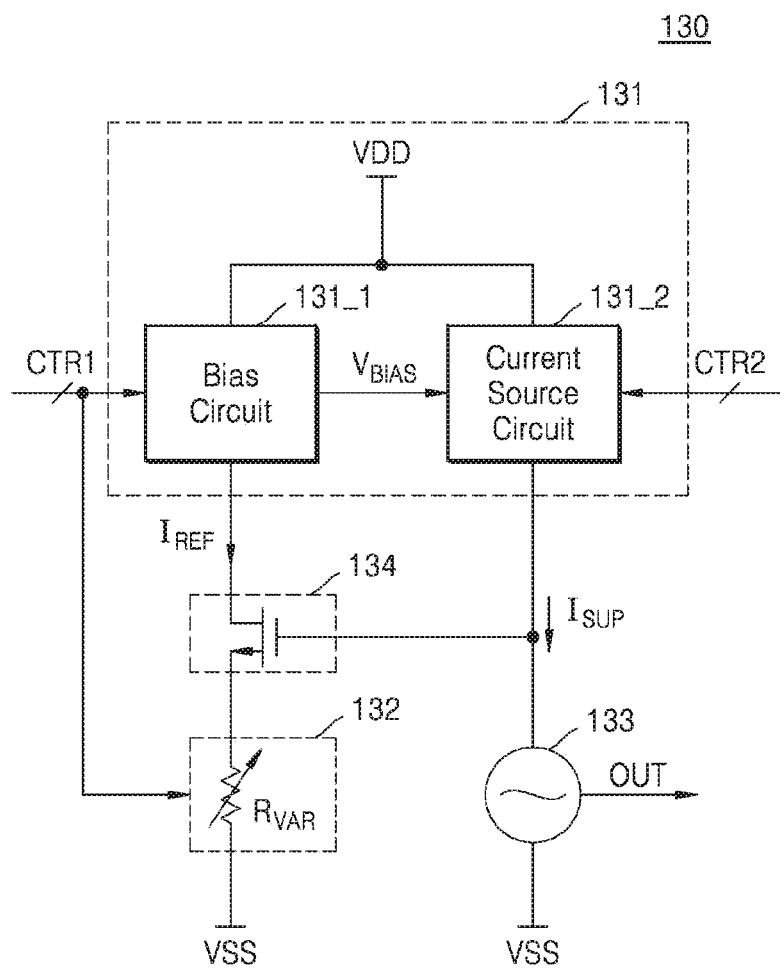
FIG. 13 is a block diagram of a DCO according to an example embodiment.

FIG. 13 is a block diagram of a DCO 130 according to an example embodiment. Specifically, the DCO 130 of FIG. 13 may include a feedback circuit 134 and may further include a current mirror 131 and a variable resistor 132 which commonly receive a first control signal CTR1. The description of FIG. 13 which is the same as the descriptions of FIGS. 3 and 6 will be omitted.

As described above with reference to FIG. 3 and the like, the DCO 130 may have a high PSRR, low noise sensitivity, and low power consumption, due to the feedback circuit 134 including an n-channel transistor. In addition, as described above with reference to FIG. 6, as a bias circuit 131_1 of the current mirror 131 and the variable resistor 132 commonly receive the first control signal CTR1, a wide frequency range of an output signal OUT may be achieved. A current source circuit 131_2 of the current mirror 131 may receive a second control signal CTR2. The first control signal CTR1 may be used to coarsely control a frequency $f_{OUT}$ of the output signal OUT, while the second control signal CTR2 may be used to finely control the frequency $f_{OUT}$ of the output signal OUT. As described above with reference to FIGS. 4A and 4B and the like, an oscillation circuit 133 may have any structure that generates an output signal OUT having a frequency $f_{OUT}$ that varies according to the magnitude of a supply current $I_{SUP}$. As a result, the DCO 130 of FIG. 13 may provide a wide frequency range as well as good electrical characteristics and may be used with respect to any kind of oscillation circuit such as the oscillation circuit 133.

Figure 14:
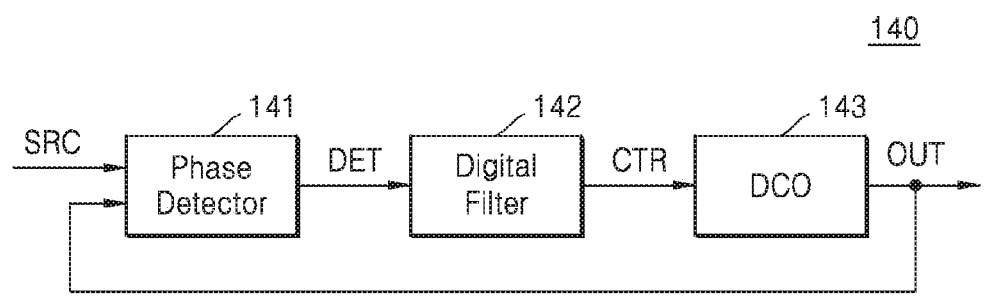
FIG. 14 is a block diagram of a digital phase-locked loop (PLL) according to an example embodiment.

FIG. 14 is a block diagram of a digital PLL 140 according to an example embodiment. The digital PLL 140 may generate an output signal OUT having a desired frequency from an oscillating input signal SRC, similar to an analog PLL using a charge pump or the like. As shown in FIG. 14, the digital PLL 140 may include a phase detector 141, a digital filter 142, and a DCO 143.

The phase detector 141 may detect a phase difference between the input signal SRC and the output signal OUT and may generate a detection signal DET corresponding to the detected phase difference. In some embodiments, the phase detector 141 may include a time-to-digital converter (TDC). The digital filter 142 may generate a control signal CTR by processing the detection signal DET, similar to a loop filter of the analog PLL. In some embodiments, the digital filter 142 may include at least one counter and may generate a control signal CTR based on an output of the at least one counter.

The DCO 143 may receive the control signal CTR from the digital filter 142 and may adjust a frequency $f_{OUT}$ of the output signal OUT according to the control signal CTR. As described above with reference to drawings, the DCO 143 may provide a wide frequency range, may provide improved PSRR and noise characteristics, and may have reduced power consumption. Accordingly, the digital PLL 140 may also have good characteristics, and as a result, the utilization of the digital PLL 140 may increase.

Figure 15:
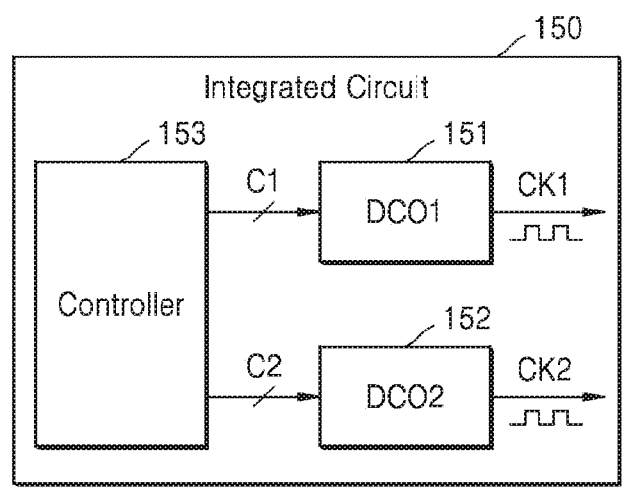
FIG. 15 is a block diagram of an integrated circuit according to an example embodiment.

FIG. 15 is a block diagram of an integrated circuit 150 according to an example embodiment. The integrated circuit 150 may include, in some embodiments, at least some of an application processor (AP), a timing controller (TCON), a semiconductor memory device, an Internet of things component, a subscriber identification module (SIM) card, a bionic sensor, a communication device, and the like. As shown in FIG. 15, the integrated circuit 150 may include a controller 153, a first DCO 151, and a second DCO 152. In some embodiments, the integrated circuit 150 may include three or more DCOs.

In some embodiments, the integrated circuit 150 may include a DCO to generate a clock signal. For example, the first DCO 151 may generate a first clock signal CK1 and the second DCO 152 may generate a second clock signal CK2. The first clock signal CK1 and the second clock signal CK2 may have different transition levels and/or different frequencies and may be supplied to other components included in the integrated circuit 150 or output to the outside of the integrated circuit 150. The controller 153 may provide control signals C1 and C2 including a plurality of bits to the first DCO 151 and the second DCO 152 in order to set the frequencies of the first clock signal CK1 and the second clock signal CK2. As described above with reference to drawings, the first DCO 151 and the second DCO 152 may not only have good electrical characteristics, but may also provide a wide frequency range. Accordingly, the performance of the integrated circuit 150 may be improved.

Figure 16:
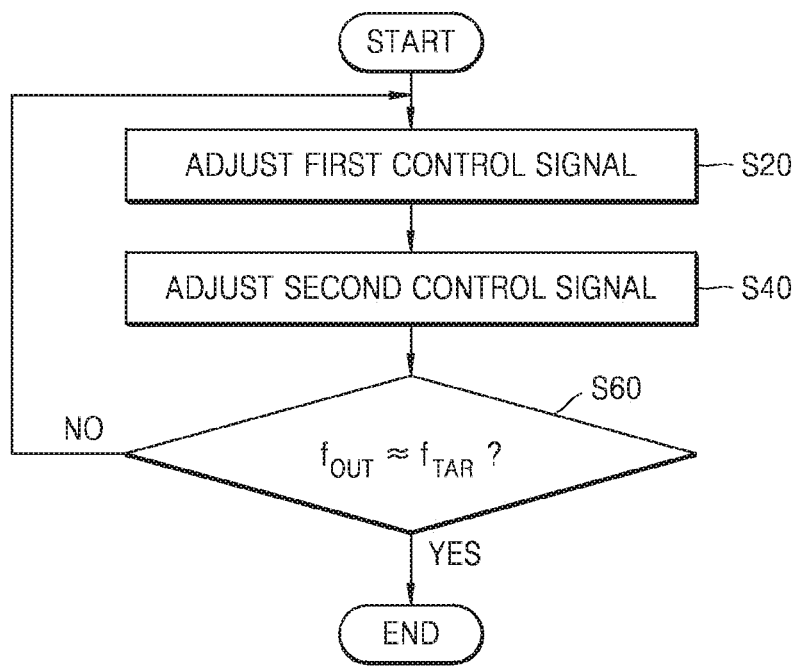
FIG. 16 is a flowchart of a method of controlling a DCO, according to an example embodiment.

FIG. 16 is a flowchart of a method of controlling a DCO, according to an example embodiment. For example, the method of FIG. 16 may be performed by the controller 153 of FIG. 15. Hereinafter, the method of FIG. 16 will be described with reference to the DCO 130 of FIG. 13.

Referring to FIG. 16, in operation S20, an operation of adjusting the first control signal CTR1 may be performed. For example, the first control signal CTR1 may also be provided to the bias circuit 131_1 of the current mirror 131 as well as the variable resistor 132, and accordingly, the output frequency $f_{OUT}$ may be defined as a convex function of the first control signal CTR1. The first control signal CTR1 may be used to coarsely adjust the output frequency $f_{OUT}$. For example, as described above with reference to FIG. 12, an output frequency $f_{OUT}$ adjacent to the target frequency $f_{TAR}$ may be obtained in a binary search manner.

In operation S40, an operation of adjusting the second control signal CTR2 may be performed. For example, the second control signal CTR2 may be provided to the current source circuit 131_2 of the current mirror 131, and accordingly, the output frequency $f_{OUT}$ may linearly increase or decrease according to the second control signal CTR2. The second control signal CTR2 may be used to finely adjust the output frequency $f_{OUT}$ and the output frequency $f_{OUT}$ may be adjusted to match the target frequency $f_{TAR}$.

In operation S60, an operation of determining whether the output frequency $f_{OUT}$ matches (e.g., approximately matches) the target frequency $f_{TAR}$ may be performed. If it is determined that the output frequency $f_{OUT}$ matches the target frequency $f_{TAR}$ according to the adjustment of the second control signal CTR2 in operation S40, the values of the first control signal CTR1 and the second control signal CTR2 may be determined and maintained. On the other hand, if it is determined that the output frequency $f_{OUT}$ does not match the target frequency $f_{TAR}$ for all the values of the second control signal CTR2 adjusted in operation S40, operation S20 may be subsequently performed and the coarse adjustment and fine adjustment of the frequency $f_{OUT}$ may be performed again. In this case, an output frequency $f_{OUT}$ adjacent to the target frequency $f_{TAR}$ may be set as a frequency different from the output frequency $f_{OUT}$ determined in operation S20 that has been previously performed.

While the inventive concept has been particularly shown and described with reference to embodiments thereof, it will be understood that various changes in form and details may be made therein without departing from the spirit and scope of the following claims.

What is claimed is:

1. A digitally-controlled oscillator, comprising:
a current mirror configured to generate a supply current based on a reference current, the current mirror comprising a bias circuit configured to generate a bias voltage based on the reference current and a first control signal;
an oscillation circuit configured to receive the supply current through an input node;
a variable resistor configured to provide a path through which the reference current passes and to provide a variable resistance according to the first control signal including at least one bit; and
a feedback circuit configured to control the reference current based on a voltage of the input node;
wherein the bias circuit and the variable resistor are configured to receive the first control signal in common.

2. The digitally-controlled oscillator of claim 1, wherein the feedback circuit is configured to increase the reference current in response to an increase in the voltage of the input node and to decrease the reference current in response to a decrease in the voltage of the input node.

3. The digitally-controlled oscillator of claim 1, wherein the variable resistor is configured to generate a reference voltage according to the reference current, wherein the feedback circuit is configured to decrease the reference current in response to an increase in the reference voltage and to increase the reference current in response to a decrease in the reference voltage.

4. The digitally-controlled oscillator of claim 1, wherein the feedback circuit comprises an n-channel transistor having a drain configured to receive the reference current from the current mirror, a source configured to provide the reference current to the variable resistor, and a gate configured to receive a voltage of the input node.

5. The digitally-controlled oscillator of claim 1, wherein the current mirror further comprises a current source circuit configured to generate the supply current based on the bias voltage.

6. The digitally-controlled oscillator of claim 5, wherein the bias circuit is configured to decrease the bias voltage in response to the first control signal that decreases a resistance of the variable resistor and to increase the bias voltage in response to the first control signal that increases the resistance of the variable resistor.

7. The digitally-controlled oscillator of claim 6, wherein the variable resistor is configured to electrically connect or disconnect a resistor to both ends of the variable resistor according to a bit of the first control signal; and wherein the bias circuit is configured to enable or disable a p-channel transistor, which is configured to provide a path through which at least a portion of the reference current passes, according to a bit of the first control signal.

8. The digital controlled oscillator of claim 5, wherein the current source circuit is configured to generate the supply current based further on a second control signal including at least one bit.

9. A digitally-controlled oscillator, comprising:
a current mirror configured to generate a supply current based on a reference current, the current mirror comprising a bias circuit configured to generate a bias voltage based on the reference current and a first control signal;
an oscillation circuit configured to receive the supply current through an input node;
a variable resistor configured to provide a variable resistance according to the first control signal including at least one bit; and
an n-channel transistor having a drain configured to receive the reference current from the current mirror, a source configured to output the reference current to the variable resistor, and a gate coupled to the input node;
wherein the bias circuit and the variable resistor are configured to receive the first control signal in common.

10. The digitally-controlled oscillator of claim 9, wherein the current mirror further comprises a current source circuit configured to generate the supply current based on the bias voltage.

11. The digitally-controlled oscillator of claim 10, wherein the bias circuit is configured to decrease the bias voltage in response to the first control signal that decreases a resistance of the variable resistor and to increase the bias voltage in response to the first control signal that increases the resistance of the variable resistor.

12. The digitally-controlled oscillator of claim 11, wherein the variable resistor is configured to electrically connect or disconnect a resistor to both ends of the variable resistor according to a bit of the first control signal,
wherein the bias circuit is configured to enable or disable a p-channel transistor, which is configured to provide a path through which at least a portion of the reference current passes, according to a bit of the first control signal.

13. The digitally-controlled oscillator of claim 10, wherein the current source circuit is configured to generate the supply current based further on a second control signal including at least one bit.

14. A digitally-controlled oscillator, comprising:
a current mirror configured to generate a supply current based on a reference current;
an oscillation circuit configured to receive the supply current through an input node; and
a variable resistor configured to provide a path through which the reference current passes and to provide a variable resistance according to a first control signal including at least one bit,
wherein the current mirror comprises a bias circuit configured to generate a bias voltage based on the first control signal, and
wherein the bias circuit and the variable resistor are configured to receive the first control signal in common.

15. The digitally-controlled oscillator of claim 14, wherein the bias circuit is configured to decrease the bias voltage in response to the first control signal that decreases a resistance of the variable resistor and to increase the bias voltage in response to the first control signal that increases the resistance of the variable resistor.

16. The digitally-controlled oscillator of claim 15, wherein the variable resistor is configured to electrically connect or disconnect a resistor to both ends of the variable resistor according to a bit of the first control signal,
wherein the bias circuit is configured to enable or disable a p-channel transistor, which is configured to provide a path through which at least a portion of the reference current passes, according to a bit of the first control signal.

17. The digitally-controlled oscillator of claim 15, wherein the supply current is determined by a convex function that monotonically increases according to a value of the first control signal.

18. The digitally-controlled oscillator of claim 14, wherein the current mirror further comprises a current source circuit configured to generate the supply current based on the bias voltage and a second control signal including at least one bit.

19. The digitally-controlled oscillator of claim 14, further comprising: a feedback circuit configured to control the reference current based on a voltage of the input node.

20. The digitally-controlled oscillator of claim 19, wherein the feedback circuit comprises an n-channel transistor having a drain configured to receive the reference current from the current mirror, a source configured to provide the reference current to the variable resistor, and a gate configured to receive a voltage of the input node.

* * * * *